(12) United States Patent
Shim et al.

(10) Patent No.: US 7,026,969 B2
(45) Date of Patent: Apr. 11, 2006

(54) ANALOG-TO-DIGITAL CONVERTING APPARATUS FOR PROCESSING A PLURALITY OF ANALOG INPUT SIGNALS AT HIGH RATE AND DISPLAY DEVICE USING THE SAME

(75) Inventors: Jae-seung Shim, Seoul (KR); Il-hyeon Ryu, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/231,924

(22) Filed: Sep. 22, 2005

(65) Prior Publication Data

US 2006/0012498 A1 Jan. 19, 2006

Related U.S. Application Data

(62) Division of application No. 10/892,443, filed on Jul. 16, 2004.

(30) Foreign Application Priority Data

Jul. 18, 2003 (KR) ............................... 2003-49134

(51) Int. Cl.
*H03M 1/00* (2006.01)
*H04N 5/268* (2006.01)
*H04N 5/64* (2006.01)

(52) U.S. Cl. ...................... 341/141; 341/155; 348/705; 348/744; 348/745

(58) Field of Classification Search ................ 341/155, 341/141
See application file for complete search history.

(56) References Cited

U.S. PATENT DOCUMENTS

| 5,084,700 | A | * | 1/1992 | Christopher ................ 341/155 |
| 5,208,545 | A | * | 5/1993 | Schweitzer, III ............ 341/155 |
| 5,808,699 | A | * | 9/1998 | Tsujihara et al. ........... 348/673 |
| 6,130,635 | A | * | 10/2000 | Jones, III .................... 341/154 |
| 6,218,975 | B1 | | 4/2001 | Tsukamoto et al. |
| 6,297,859 | B1 | * | 10/2001 | George ....................... 348/747 |
| 6,310,570 | B1 | * | 10/2001 | Rumreich et al. .......... 341/155 |
| 6,346,908 | B1 | * | 2/2002 | Jones, III .................... 341/154 |
| 6,456,219 | B1 | * | 9/2002 | Schreiber et al. ........... 341/155 |
| 6,515,905 | B1 | * | 2/2003 | Hikida ..................... 365/185.2 |

FOREIGN PATENT DOCUMENTS

| JP | 06-006219 A | 1/1994 |
| JP | 07-131346 A | 5/1995 |
| JP | 2003-18037 A | 1/2003 |
| JP | 2003-032112 A | 1/2003 |
| KR | 10-0218328 B1 | 6/1999 |
| KR | 20-0157336 Y1 | 9/1999 |
| KR | 2001-0083331 A | 9/2001 |
| KR | 2002-0000608 A | 1/2002 |
| KR | 2002-0064523 A | 8/2002 |
| KR | 10-0366381 B1 | 12/2002 |
| KR | 2003-0028940 A | 4/2003 |

* cited by examiner

Primary Examiner—John B. Nguyen
Assistant Examiner—Lam T. Mai
(74) Attorney, Agent, or Firm—Sughrue Mion, PLLC

(57) ABSTRACT

An analog-to-digital converting apparatus for rapidly processing a plurality of analog input signals at a high rate and a display device using the same. The apparatus includes a clock signal generator that generates a clock signal with a predetermined frequency; a control signal generator that generates a switching control signal using the clock signal; a multiplexer (MUX) that receives and selectively outputs signals of the plurality of analog input signals according to the switching control signal; and an analog-to-digital converter (ADC) that converts an analog signal selected and output by the MUX to a digital signal.

3 Claims, 3 Drawing Sheets

FIG. 4

| DATA 1-1 | DATA 1-2 | DATA 1-3 | DATA 1-4 | DATA 1-5 | DATA 1-6 | ... | DATA 1-M |
| --- | --- | --- | --- | --- | --- | --- | --- |
| DATA 2-1 | DATA 2-2 | DATA 2-3 | DATA 2-4 | DATA 2-5 | DATA 2-6 | ... | DATA 2-M |
| DATA 3-1 | DATA 3-2 | DATA 3-3 | DATA 3-4 | DATA 3-5 | DATA 3-6 | ... | DATA 3-M |
| ... | ... | ... | ... | ... | ... | ... | ... |
| DATA N-1 | DATA N-2 | DATA N-3 | DATA N-4 | DATA N-5 | DATA N-6 | ... | DATA N-M |

ANALOG-TO-DIGITAL CONVERTING APPARATUS FOR PROCESSING A PLURALITY OF ANALOG INPUT SIGNALS AT HIGH RATE AND DISPLAY DEVICE USING THE SAME

This is a divisional of application Ser. No. 10/892,443 filed Jul. 16, 2004; the disclosure of which is incorporated herein by reference.

This application claims priority from Korean Patent Application No. 2003-49134, filed on Jul. 18, 2003, in the Korean Intellectual Property Office, the disclosure of which is incorporated herein in its entirety by reference.

BACKGROUND OF THE INVENTION

1. Field of the Invention

The present invention relates to a signal processing apparatus, and more particularly, to an analog-to-digital converting apparatus for rapidly processing a plurality of analog input signals and a display device using the same.

2. Description of the Related Art

Typically, in order to convert a plurality of analog input signals to digital signals using an analog-to-digital converter (ADC) in a signal processing apparatus, an analog-to-digital converting apparatus as shown in FIG. 1 is used.

Referring to FIG. 1, a conventional analog-to-digital converting apparatus includes a multiplexer (MUX) 110, an ADC 120, and a microprocessor 130.

The MUX 110 receives multiple analog signals $S_1$, $S_2$, ..., $S_N$, and selects and outputs one of the input analog signals according to a switching control signal SEL generated by the microprocessor 130.

The ADC 120 converts the analog signal output by the MUX 110 to a digital signal and outputs it to the microprocessor 130.

The microprocessor 130 generates the switching control signal SEL and provides the SEL to a control terminal of the MUX 110 for controlling the MUX 110. The microprocessor 130 also uses the digital signals output by the ADC 120 in a predetermined control algorithm to produce some control values.

The analog-to-digital converting apparatus may be applied to an apparatus such as an apparatus for an automatic color coherence correction. In this case, the predetermined control algorithm corresponds to an automatic color coherence control algorithm, the multiple analog signals $S_1$, $S_2$, ..., $S_n$ $S_N$, correspond to signals that are detected by photo-sensors (not shown) arranged over different positions on a screen, and the control values generated by the microprocessor 130 correspond to RGB color coherence correction gain values.

However, in the conventional apparatus, the MUX works according to a switching control signal SEL generated by the microprocessor 130, and so a data processing rate of the MUX is limited. Consequently, the sampling speed for input analog signals is also limited to an extent. More particularly, the increase in the number of a plurality of input analog signals input to the MUX 130 causes harmful effects on the data processing rate of the microprocessor 130. In addition, if the input analog signals are affected by any surrounding noise, such as an impulse noise, data processing results may be erroneous.

SUMMARY OF THE INVENTION

The present invention provides an analog-to-digital converting apparatus for processing a plurality of analog input signals at a high rate and a display device using the same.

According to an aspect of the present invention, there is provided an analog-to-digital converting apparatus for rapidly processing a plurality of analog input signals, the apparatus comprising, a clock signal generator that generates a clock signal with a predetermined frequency; a control signal generator that generates a switching control signal using the clock signal; a multiplexer (MUX) that receives and selectively outputs signals of the plurality of analog input signals according to the switching control signal; and an analog-to-digital converter (ADC) that converts an analog signal selected and output by the MUX to a digital signal. Further, the control signal generator may be a counter circuit.

According to another aspect of the present invention, there is provided an analog-to-digital converting apparatus for rapidly processing a plurality of analog input signals, the apparatus comprising, a clock signal generator that generates a clock signal with a predetermined frequency; a control signal generator that generates switching control signals and buffer control signals using the clock signal; a multiplexer (MUX) that receives and selectively outputs the plurality of analog input signals according to the switching control signals; an analog-to-digital converter (ADC) that converts an analog input signal selected and output by the MUX to a digital signal; a buffer memory that sequentially stores the digital signals according to the buffer control signals in the unit of the number of the analog signals input to the MUX, the length of the digital signals corresponding to the number of digital filter taps, and sequentially outputs digital signals in the unit of the number of digital filter taps; a digital filter that multiplies each of the digital signals output by the buffer memory in the unit of the number of digital filter taps by predetermined tap coefficients to remove noise; and a register block that sequentially stores the filtered digital signals output by the digital filter. Further, the control signal generator may be a counter circuit and the buffer control signals may be generated in synchronization with a data processing rate of the ADC.

According to still another aspect of the present invention, a display device is provided comprising, a test signal generator that generates a predetermined test pattern signal; a Red/Green/Blue cathode-ray-tube (RGB CRT) driving unit that amplifies the predetermined test pattern signal by a gain value and outputs the amplified predetermined test pattern signal as an RGB signal; an RGB CRT that generates a photoelectric signal that corresponds to the RGB signal output by the RGB CRT driving unit; a plurality of photo-sensors that are arranged over predetermined positions on a display screen and detect the photoelectric signals projecting into the RGB CRT; a plurality of amplifiers that amplify photoelectric signals detected by the plurality of photo-sensors; a control signal generator that generates a switching control signal and a buffer control signal using the clock signal; a multiplexer (MUX) that receives signals output by the plurality of amplifiers and selectively outputs a signal according to the switching control signal; an analog-to digital converter (ADC) that converts an analog signal output by the MUX to a digital signal; a buffer memory that sequentially stores the digital signals in a unit of the number of signals input to the MUX, the length of the digital signals corresponding to the number of digital filter taps, and sequentially outputs the digital signals in the unit of the number of digital filter taps; a digital filter that multiplies each of the digital signals output by the buffer memory in the unit of the number of digital filter taps by predetermined tap coefficients to remove noise; a register block that sequentially stores the filtered digital signals output by the digital filter; and a microprocessor that reads a digital signal from the register block, uses the digital signal in a predetermined color coherency correction process, and generates a gain control signal for the color coherence correction. Further, the control signal generator may be a counter circuit and the buffer control signals may be generated in synchronization with a data processing rate of the ADC.

BRIEF DESCRIPTION OF THE DRAWINGS

The above and other aspects and advantages of the present invention will become more apparent by describing in detail an exemplary embodiment thereof with reference to the attached drawings in which:

FIG. 4 shows an embodiment of a data storage format in a buffer memory.

DETAILED DESCRIPTION OF THE INVENTION

Figure 1:
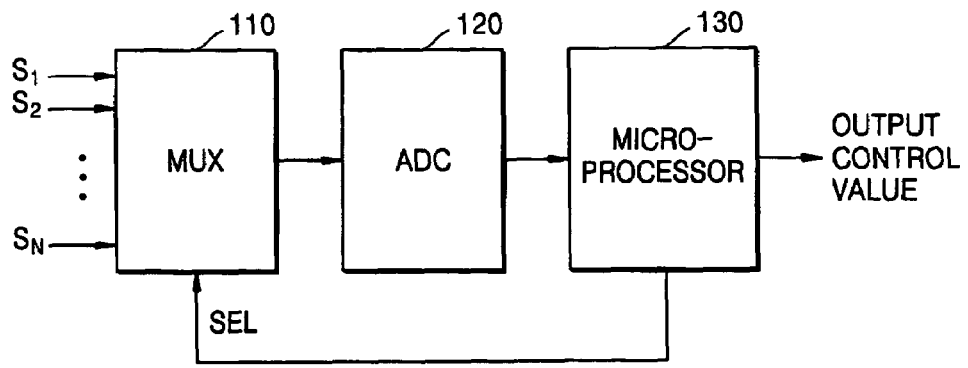
FIG. 1 is a schematic block diagram of a conventional analog-to-digital converting apparatus for converting a plurality of analog input signals to digital signals.
Figure 2:
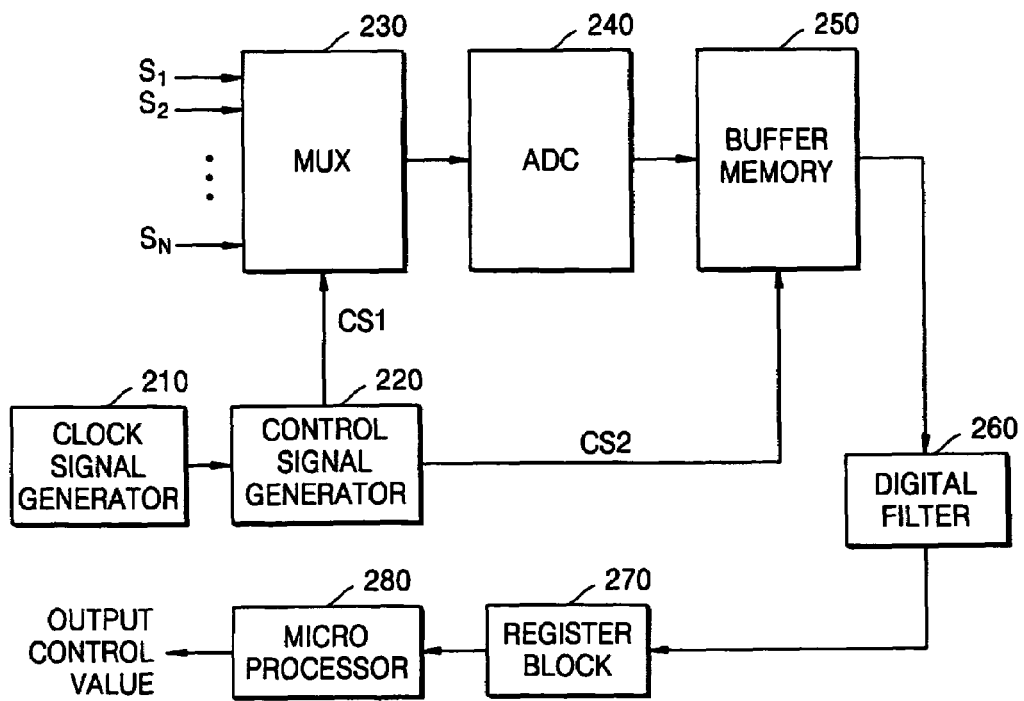
FIG. 2 is a schematic block diagram of an analog-to-digital converting apparatus for processing a plurality of analog input signals at a high rate, according to the present invention.

FIG. 2 is a schematic block diagram of an analog-to-digital converting apparatus for processing a plurality of analog input signals at a high rate according to the present invention.

Referring to FIG. 2, the analog-to-digital converting apparatus includes a clock signal generator 210, a control signal generator 220, a multiplexer (MUX) 230, an analog-to-digital converter (ADC) 240, a buffer memory 250, a digital filter 260, a register block 270, and a microprocessor 280.

The clock signal generator 210 generates a clock signal to be used to generate a switching control signal applied to the MUX 230. The frequency of the clock signal is proportional to a frequency multiplier by which an input signal is multiplied. In this case, the frequency of the input signal corresponds to the frequency of a signal output by a photo sensor, however, a conventional clock signal is generated by multiplying the horizontal synchronous frequency (H-SYNC) of, for example, a television.

The control signal generator 220 divides the frequency of the clock signal and generates a switching control signal CS1 used by the MUX 230 to select an input signal. The control signal generator 220 also generates a buffer control signal CS2 to control a data storage rate and access timing of the buffer memory 250. The buffer control signal CS2 should be generated so as to be in synchronization with the data processing rate of the ADC 240. The control signal generator 220 can be designed, for example, as a counter circuit.

The MUX 230 receives multiple analog signals $S_1$, $S_2$, ..., $S_N$, selects one of the analog signals according to the switching control signal CS1 generated by the control signal generator 220, and outputs the selected analog signal to the ADC 240.

The ADC 240 converts the analog signal received from the MUX 230 to a digital signal and outputs the digital signal to the buffer memory 250.

The buffer memory 250 sequentially stores the 1 st through N-th digital signals converted by the ADC 240, the length of the digital signals corresponding to the number of taps of the digital filter 260, according to the buffer control signal CS2, the format of which is shown in FIG. 4. In FIG. 4, N is the number of input signals, and M is the number of taps of the digital filter 260.

Specifically, the buffer memory 250 stores (digital) data of the input signals $S_1$–$S_N$, by sequentially filling the first column with data in the order of DATA 1-M, DATA 2-M, DATA 3-M, ..., DATA N-M, and then filling the next column with data of DATA 1-(M-1), ..., DATA N-(M-1). In this way, the buffer memory 250 can be filled with the data of all of the input signals $S_1$–$S_N$. When the buffer memory 250 is filled with data of all of the input signals $S_1$, $S_2$, ..., $S_N$, it begins to output data DATA1-1, DATA 1-2, ..., DATA1-M that correspond to the input signal $S_1$, to the digital filter 260, and then sequentially outputs remaining data that correspond to $S_2$, ..., $S_N$, in a similar way.

The digital filter 260 (FIG. 2) performs digital filtering on the data by applying tap coefficients to data DATA1-1, DATA1-2, ..., DATA1-M and outputs the digital filtered data. In a similar way, remaining data that correspond to input signals $S_2$, ..., $S_N$ are digitally-filtered and output.

The register block 270, which is comprised of a plurality of register arrays, sequentially stores the data output from the digital filter 260.

The microprocessor 280 reads data from the register block 270 and applies a predetermined algorithm, such as the automatic color coherence control algorithm, to the data to generate control values.

An embodiment of a display device employing the analog-to-digital apparatus for rapidly processing a plurality of analog input signals, according to the present invention will now be described.

Figure 3:
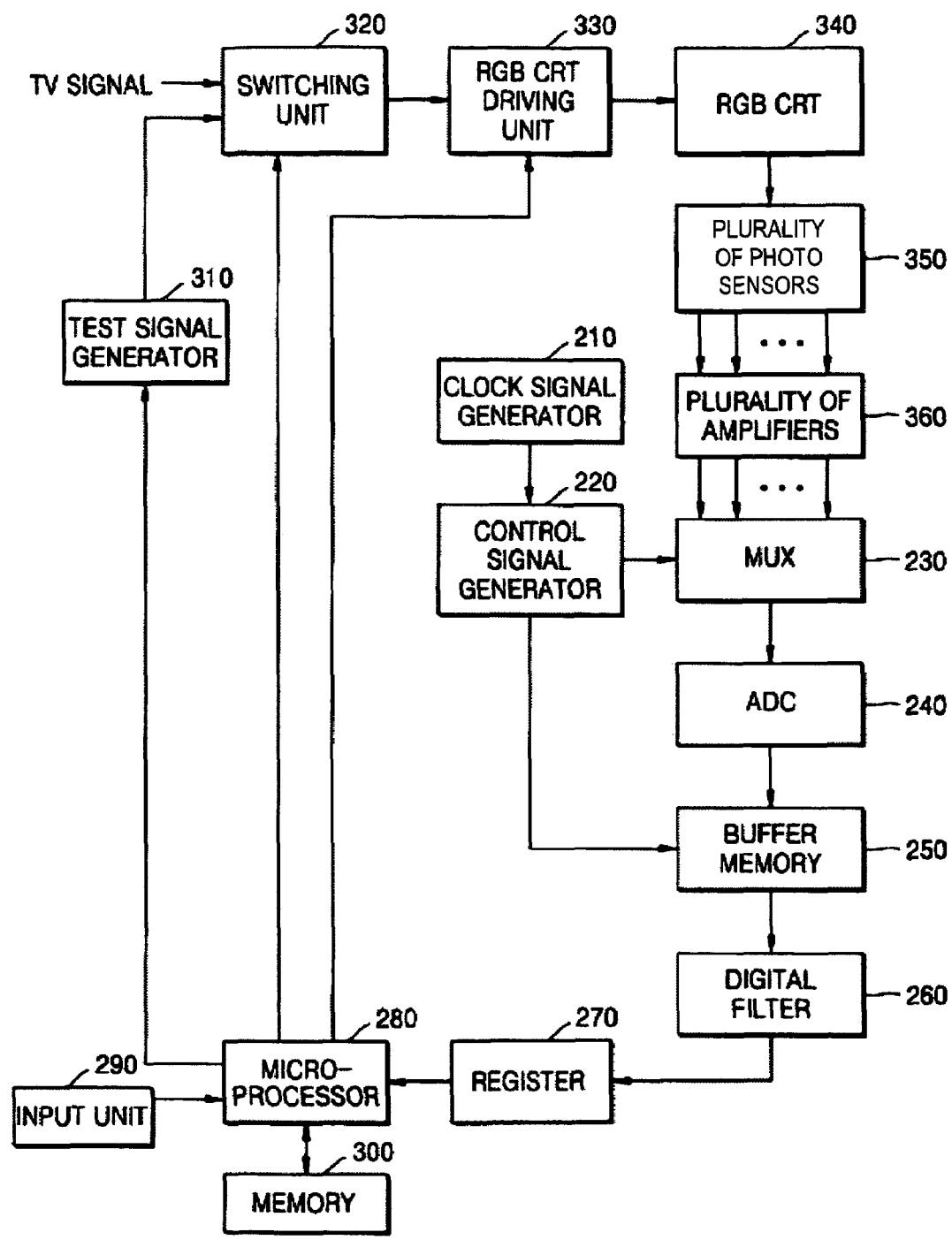
FIG. 3 is a schematic block diagram of a display device employing the analog-to-digital converting apparatus for processing a plurality of analog input signals at a high rate, according to the present invention.

FIG. 3 shows a schematic diagram of a projection television, i.e., a type of display device, employing the analog-to-digital apparatus for rapidly processing a plurality of analog input signals, according to the present invention.

The projection television includes a clock signal generator 210, a control signal generator 220, a MUX 230, an ADC 240, a buffer memory 250, a digital filter 260, a register block 270, a microprocessor 280, an input unit 290, a memory 300, a test signal generator 310, a switching unit 320, a Red/Green/Blue cathode-ray-tube (RGB CRT) driving unit 330, an RGB CRT 340, a plurality of photo-sensors 350 and a plurality of amplifiers 360.

Since the clock signal generator 210, the control signal generator 220, the MUX 230, the ADC 240, the buffer memory 250, the digital filter 260 and the register block 270 are the same components as shown in FIG. 2, and have already been described in detail, an explanation thereof will be omitted.

The input unit 290 has various kinds of keys to operate the projection television, and, in particular, key buttons to instruct the projection television to enter a color coherence correction mode.

The test signal generator 310 generates RGB test pattern signals to measure the intensity of each of the R, G, and B components of light at positions on the screen during the color coherence correction mode, and the test pattern signals for the R, G, B are applied to positions over which a plurality of photo-sensors 350 are arranged.

The switching unit 320 selects and outputs a processed television signal during a television mode, and selects and outputs an RGB test pattern signal generated by the test signal generator 310 during the color coherence correction mode.

The RGB CRT driving unit 330 amplifies RGB signals by RGB gain values that correspond to RGB gain control signals supplied by the microprocessor 280 and outputs the result. During the color coherence correction mode, the RGB CRT driving unit 330 amplifies the RGB test pattern signals at positions by the RGB gain values for coordinates of the screen stored in the memory 300 as initial values.

The RGB CRT 340 outputs photoelectric signals that correspond to the amplified RGB test pattern signals at positions output by the RGB CRT driving unit 330.

A plurality of photo-sensors 350 are arranged over a plurality of positions on the display screen. The photo-sensors detect photoelectric signals projected on the display screen and convert them to electrical signals.

A plurality of amplifiers 360 amplify each of the plurality of electrical signals detected by the photo-sensors 350, and output the amplified signals to the MUX 230.

The MUX 230 selects and outputs one of the multiple analog signals output by the plurality of amplifiers 360 according to a switching control signal CS1 generated by the control signal generator 220, as in the operation described above with reference to FIG. 2.

As described above with reference to FIG. 2, an analog signal output from the MUX 230 is converted to a digital signal by the ADC 240, and then the digital signal is input to the microprocessor 280 via the buffer memory 250, digital filter 260 and register block 270.

The microprocessor 280 analyzes a key instruction generated by the input unit 290, and controls overall components of the projection television according to the result obtained by analyzing the key instruction. In particular, microprocessor 280 controls the test signal generator 310 to generate test pattern signals during the color coherence correction mode, and controls the switching unit 320 to select test pattern signals generated by the test signal generator 310 and output the selected test pattern signals to the RGB CRT driving unit 330.

In addition, the microprocessor 280 finds a position in which the intensity of each of RGB output by each of the photo-sensors is the maximum, from among initial intensity values at positions stored in the memory 300 at the initial stage of the color coherence correction mode, and controls the signal convergence of the RGB CRT driving unit 330. The microprocessor 280 also reads digital data of the input signals detected by the photo-sensors 350 from the register block 270 during the color coherence correction mode and uses the digital data in a color coherence correction process program stored in the memory 300 to produce gain control values for the color coherence correction.

During the color coherence correction process, the microprocessor 280 compares digital data of the input signals by positions with corresponding reference values, obtains a difference between a position having the maximum RGB intensity output by one of the photo-sensors 350 and a position having the maximum reference value, and performs a convergence adjustment to compensate for the difference. That is, the microprocessor adjusts the position having the maximum RGB intensity output by one of the photo-sensors 350 to conform with the position having the maximum reference value, and then updates the memory 300 with the convergence-adjusted values by positions.

As described above, the microprocessor 280 uses data read from the register block 270 to control the convergence so as to bring positions into accurate color and focus.

The memory 300 stores a program and data to perform the color coherence correction process. The memory 300 also stores positions in which RGB intensity detected by the photo-sensors 350 is the maximum in each of the coordinates, as well as corresponding RGB intensity, as initial values. The initial values in the memory 300 are updated with later convergence-adjusted RGB values by positions, adjusted and determined through the color coherence correction mode.

The switching control signal CS1 used by the MUX 230 to select an input signal, is generated by a counter circuit using a high frequency clock signal, so that multiple input signals can be rapidly processed. Also, the digital filter 260 is used to remove exterior noise, thereby making the data more reliable.

Accordingly, as described above, with a frequency-divided clock signal generated by the clock signal generator 210, the MUX in the analog-to-digital converting apparatus is controlled to perform switching, in a manner that allows the apparatus to rapidly process the input analog signals. The digital signals can be further accurately processed by the digital filer 260 that removes exterior noise.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A display device comprising;
   a test signal generator that generates a predetermined test pattern signal;
   a Red/Green/Blue cathode-ray-tube (RGB CRT) driving unit that amplifies the predetermined test pattern signal by a gain value and outputs the amplified predetermined test pattern signal as an RGB signal;
   a RGB CRT that generates a photoelectric signal that corresponds to the RGB signal output by the RGB CRT driving unit;
   a plurality of photo-sensors that are arranged over predetermined positions on a display screen and detect the photoelectric signals projecting into the RGB CRT;
   a plurality of amplifiers that amplify photoelectric signals detected by the plurality of photo-sensors;
   a control signal generator that generates a switching control signal and a buffer control signal using the clock signal;
   a multiplexer (MUX) that receives signals output by the plurality of amplifiers and selectively outputs a signal according to the switching control signal;
   an analog-to digital converter (ADC) that converts analog signals output by the MUX to digital signals;
   a buffer memory that sequentially stores the digital signals corresponding to the number of signals input to the MUX, the length of the digital signals corresponding to a number of digital filter taps, and sequentially outputs the digital signals corresponding to the number of digital filter taps;
   a digital filter that multiplies each of the digital signals output by the buffer memory corresponding to the number of digital filter taps by predetermined tap coefficients to remove noise;

a register block that sequentially stores filtered digital signals output by the digital filter; and a microprocessor that reads a digital signal from the register block, uses the digital signal in a predetermined color coherency correction process, and generates a gain control signal for the color coherence correction.

2. The display device of claim 1, wherein the control signal generator comprises a counter circuit.

3. The display device of claim 1, wherein the buffer control signals are generated in synchronization with a data processing rate of the ADC.

* * * * *